(12) United States Patent
Huang et al.

(10) Patent No.: US 10,872,918 B2
(45) Date of Patent: Dec. 22, 2020

(54) OPTICAL ISOLATION STRUCTURE FOR REDUCING CROSSTALK BETWEEN PIXELS AND FABRICATION METHOD THEREOF

(71) Applicant: TAIWAN SEMICONDUCTOR MANUFACTURING CO., LTD., Hsinchu (TW)

(72) Inventors: Po-Han Huang, Tainan (TW); Tzu-Hsiang Chen, Changhua County (TW); Shih-Pei Chou, Tainan (TW); Jiech-Fun Lu, Tainan County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/471,212

(22) Filed: Mar. 28, 2017

(65) Prior Publication Data
US 2018/0286894 A1 Oct. 4, 2018

(51) Int. Cl.
*H01L 27/146* (2006.01)
*H01L 21/762* (2006.01)

(52) U.S. Cl.
CPC .... *H01L 27/1463* (2013.01); *H01L 21/76224* (2013.01); *H01L 27/14612* (2013.01); *H01L 27/14632* (2013.01); *H01L 27/14643* (2013.01); *H01L 27/14687* (2013.01)

(58) Field of Classification Search
CPC ........... H01L 27/1463; H01L 27/14632; H01L 21/76224; H01L 27/14643; H01L 27/14687; H01L 27/14612

USPC .......................................................... 257/506
See application file for complete search history.

(56) References Cited

U.S. PATENT DOCUMENTS

| | | | | |
|---|---|---|---|---|
| 5,976,936 | A * | 11/1999 | Miyajima | H01L 29/7828 438/268 |
| 2002/0093041 | A1* | 7/2002 | Hong | H01L 21/76224 257/301 |
| 2004/0256634 | A1* | 12/2004 | Sugihara | H01L 21/76224 257/192 |
| 2005/0112839 | A1* | 5/2005 | Wu | H01L 21/26586 438/389 |
| 2005/0142799 | A1* | 6/2005 | Seo | H01L 21/76224 438/424 |
| 2005/0176214 | A1* | 8/2005 | Chang | H01L 21/76232 438/424 |
| 2006/0043456 | A1* | 3/2006 | Derderian | H01L 27/115 257/314 |

(Continued)

*Primary Examiner* — Mohammad M Hoque
(74) *Attorney, Agent, or Firm* — McClure, Qualey & Rodack, LLP

(57) ABSTRACT

An optical isolation structure and a method for fabricating the same are provided. The optical isolation structure includes an epitaxial layer and a dielectric layer. The epitaxial layer and the dielectric layer are formed in a deep trench of a semiconductor substrate. The epitaxial layer covers a lower portion of sidewall of the trench, and the dielectric layer covers an upper portion of the sidewall of the trench. In the method for fabricating the optical isolation structure, at first, shallow trenches are formed in the semiconductor substrate. Then, the dielectric layer is formed in the shallow trenches. Thereafter, deep trenches are formed passing through the dielectric layers. Then, the epitaxial layer is formed in the deep trenches.

20 Claims, 14 Drawing Sheets

(56) References Cited

U.S. PATENT DOCUMENTS

| | | | | |
|---|---|---|---|---|
| 2006/0183294 A1* | 8/2006 | Zhang | ............... | H01L 21/76224 438/424 |
| 2008/0258268 A1* | 10/2008 | Cheng | .................... | H01L 21/84 257/622 |
| 2009/0096055 A1* | 4/2009 | Montgomery | .... | H01L 21/76232 257/510 |
| 2011/0096208 A1* | 4/2011 | Roy | .................. | H01L 27/14603 348/243 |
| 2012/0098057 A1* | 4/2012 | Kim | .................... | H01L 21/2255 257/330 |
| 2013/0328157 A1* | 12/2013 | Cheng | ................. | H01L 29/0649 257/506 |
| 2014/0099772 A1* | 4/2014 | Chetlur | ............. | H01L 21/76898 438/430 |
| 2015/0243763 A1* | 8/2015 | Cheng | ............... | H01L 27/14614 438/270 |
| 2016/0163749 A1* | 6/2016 | Yang | ................. | H01L 21/76227 257/446 |
| 2016/0225813 A1* | 8/2016 | Liao | .................... | H01L 27/1464 |

* cited by examiner

OPTICAL ISOLATION STRUCTURE FOR REDUCING CROSSTALK BETWEEN PIXELS AND FABRICATION METHOD THEREOF

BACKGROUND

In semiconductor technology, image sensors are used for sensing light emitted towards them to form an image. For converting various photo energy of the light into electrical signals, the image sensor includes pixels having photosensitive diodes, reset transistors, source follower transistors, pinned layer photodiodes, and/or transfer transistors. In general, the image sensor may be a complementary metal-oxide-semiconductor (CMOS) image sensor (CIS), an active-pixel sensor (APS), a passive-pixel sensor and a charged-coupled device (CCD) sensor. The above image sensor is widely used in various applications such as digital camera or mobile phone camera devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
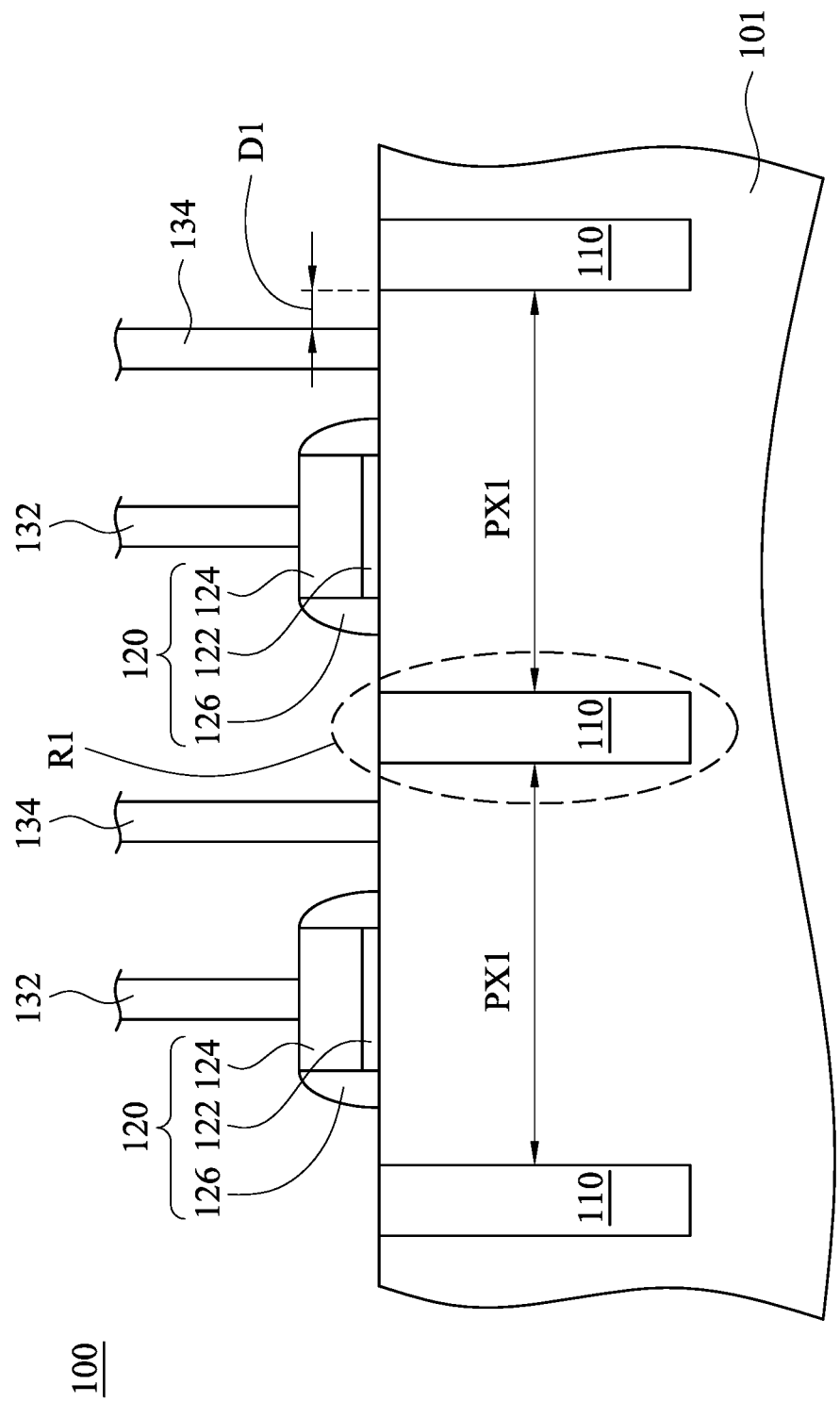
FIG. 1A is a schematic cross-sectional view of an image sensor in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Embodiments of the present disclosure are directed to an optical isolation structure used in an image sensor to reduce crosstalk between pixels of the image sensor. The optical isolation structure includes an epitaxial layer and dielectric layers disposed in a deep trench of a semiconductor substrate. The deep trench includes a bottom and a sidewall adjoining the bottom. The sidewall of the deep trench includes a lower portion and an upper portion, in which the upper portion adjoins a surface of the semiconductor substrate. The epitaxial layer covers the lower portion of the sidewall and the dielectric layers covers the upper portion of the sidewall, thereby providing electric isolation between a contact of a pixel and the epitaxial layer and preventing electrical leakage between the contact and the epitaxial layer.

Referring to FIG. 1A, FIG. 1A is a schematic cross-sectional view of an image sensor 100 in accordance with some embodiments of the present disclosure. The image sensor 100 includes a semiconductor substrate 101, plural optical isolation structures 110, plural transfer gates 120 and plural contacts 132 and 134. The optical isolation structures 110 are disposed in the semiconductor substrate 101 to define plural pixel regions PX1 in the semiconductor substrate 101. In some embodiments, the optical isolation structures 110 are formed in a grid pattern.

In some embodiments, the semiconductor substrate 101 may be a semiconductor material and may include structures including a graded layer or a buried oxide, for example. In some exemplary examples, the semiconductor substrate 101 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 101. Alternatively, the semiconductor substrate 101 may be an active layer of a semiconductor-on-insulator (SOI) substrate or a multi-layered structure such as a silicon-germanium layer formed on a bulk silicon layer.

In some embodiments, light-sensitive elements (not shown) are disposed in the pixel regions PX1 to convert various types of photo energy of light into electrical signals. The light-sensitive elements can be formed by doping the pixel regions PX1 with an n-type dopant. However, embodiments of the present disclosure are not limited thereto.

The transfer gates 120 are disposed on the pixel regions PX1 and electrically connected to the light-sensitive elements to transfer the electrical signals generated by the light-sensitive element to peripheral circuits. For example, the peripheral circuits include source followers to amplify the electrical signals.

In some embodiments, each of the transfer gates 120 includes a gate dielectric layer 122, a gate electrode layer 124 and spacers 126. The gate electrode layer 124 is formed on the gate dielectric layer 122, and the spacers 126 are formed on sidewalls of the gate electrode layer 124 and the spacers 126.

The gate dielectric layer 122 can be formed by thermal oxidation, chemical vapor deposition, sputtering, or any other methods known and used in the art for forming a gate dielectric. In some embodiments, the gate dielectric layer 122 of the can be formed from a high permittivity (high-k) material (e.g., with a relative permittivity greater than about 5) such as lanthanum oxide, aluminum oxide, hafnium oxide, hafnium oxynitride, or zirconium oxide, or combinations thereof. Additionally, any combination of silicon dioxide, silicon oxynitride, and/or high-k materials may also be used for the gate dielectric layer 122.

The gate electrode layer 124 can be formed from a conductive material and may be selected from a group comprising of polycrystalline-silicon (poly-Si), polycrystalline silicon-germanium (poly-SiGe), metallic nitrides, metallic silicides, metallic oxides, metals, combinations of these, and the like. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, etc. The gate electrode layer 124 may be deposited by chemical vapor deposition (CVD), sputter deposition, or other techniques known and used in the art for depositing conductive materials.

The spacers 126 may be formed from a dielectric material, such as silicon nitride, silicon carbide, silicon oxynitride, other suitable materials, and/or combinations, but embodiments of the present disclosure are not limited thereto. The spacers 126 may be formed by methods utilized to form such a layer, such as chemical vapor deposition (CVD), plasma enhanced CVD, sputter, and other methods known in the art.

The contacts 132 are disposed on the transfer gates 120 to apply control signals on the transfer gates 120, and the contacts 134 are disposed on source/drain regions (not shown) to output the electrical signals to the peripheral circuits. In some embodiments, a distance D1 between the isolation structure 110 and the contact 134 is equal to or smaller than 30 nm.

Figure 1B:
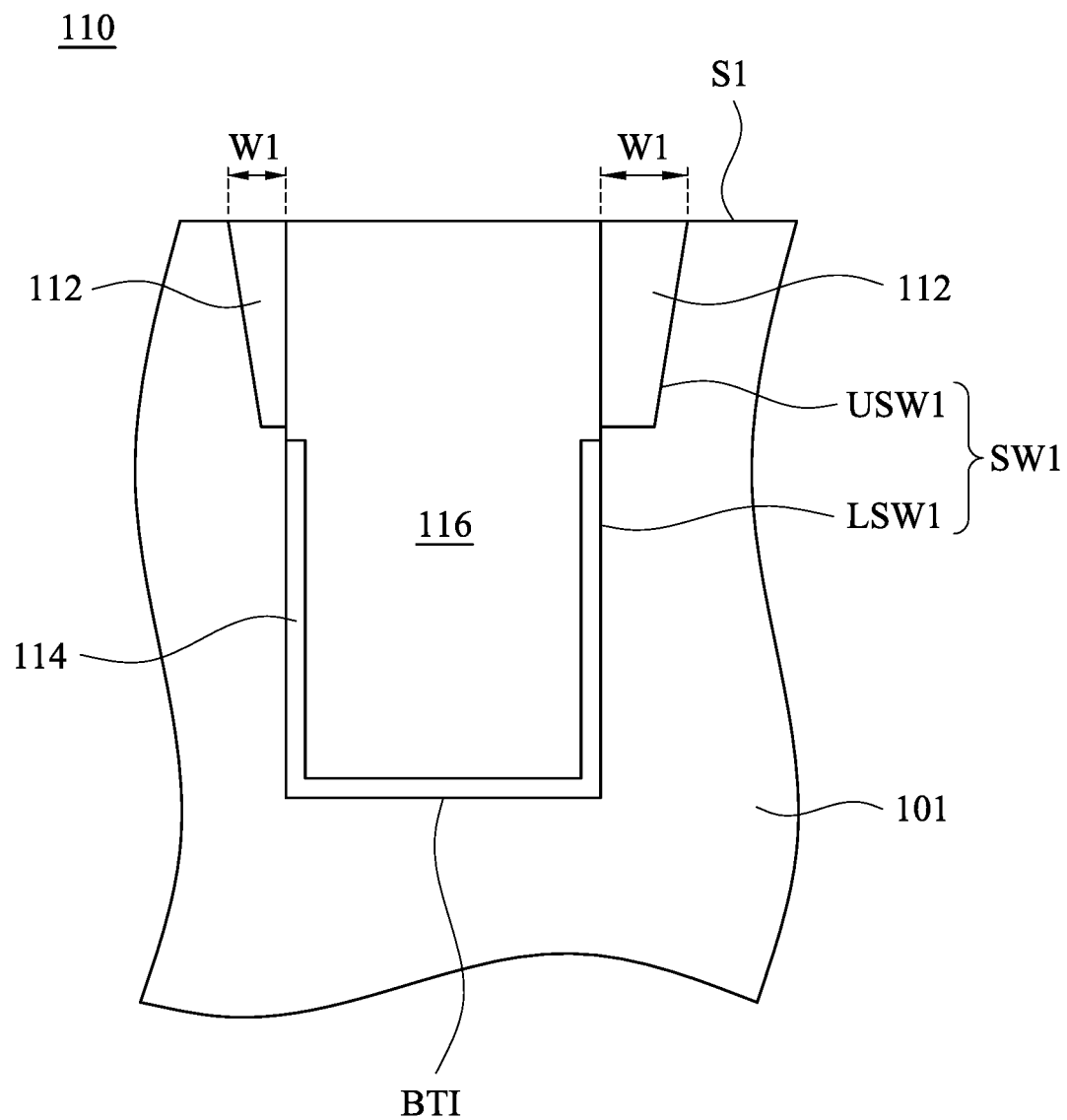
FIG. 1B is an enlarged diagram showing the region R1 in FIG. 1A

Referring to FIG. 1B, FIG. 1B is an enlarged diagram showing the region R1 in FIG. 1A. As show in FIG. 1B, the optical isolation structure 110 includes dielectric layers 112, an epitaxial layer 114, and a poly-silicon layer 116. The dielectric layers 112, the epitaxial layer 114 and the poly-silicon layer 116 are disposed in a deep trench in the semiconductor substrate 101. The deep trench includes a bottom BT1 and sidewall SW1 located on the bottom BT1. The sidewall SW1 of the deep trench includes a lower portion LSW1 and an upper portion USW1. The upper portion USW1 adjoins a surface S1 of the semiconductor substrate 101.

The epitaxial layer 114 covers the lower portion LSW1 of the sidewall SW1 to reflect light emitted to the optical isolation structure 110. In some embodiments, the epitaxial layer 114 further covers the bottom BT1 of the deep trench. The dielectric layers 112 covers the upper portion USW1 of the sidewall SW1, and thus the dielectric layers 112 are located between the epitaxial layer 114 and the surface S1 of the semiconductor substrate 101. When a contact (for example the contact 134) is located adjacent to the optical isolation structure 110 (for example the distance D1 is equal to or smaller than 30 nm), the dielectric layers 112 are capable of preventing electrical leakage between the contact and the epitaxial layer 114. In some embodiments, the dielectric layers 112 are formed from oxide, but embodiments of the present invention are not limited thereto.

In some embodiments, each of the dielectric layers 112 has width W1. The width W1 is progressively decreasing along a direction from a top of the deep trench to the bottom BT1 of the deep trench.

Figure 2A:
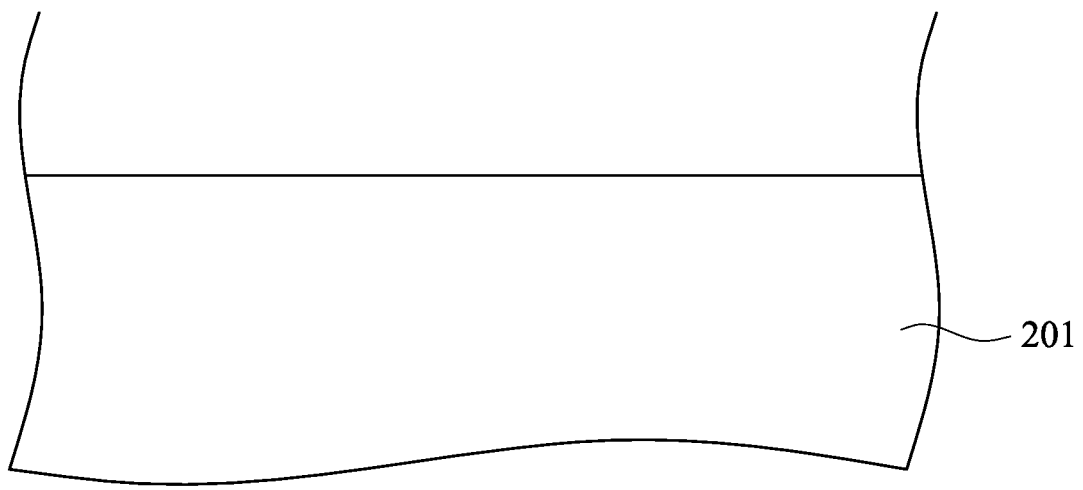
FIG. 2A to FIG. 2G are cross-sectional views of intermediate stages showing a method for fabricating optical isolation structures in accordance with some embodiments of the present disclosure.

Referring to FIG. 2A to FIG. 2G, FIG. 2A to FIG. 2G are cross-sectional views of intermediate stages showing a method for fabricating optical isolation structures in accordance with some embodiments of the present disclosure. As shown in FIG. 2A, a semiconductor substrate 201 is provided at first. In some embodiments, the semiconductor substrate 201 may be a semiconductor material and may include structures including a graded layer or a buried oxide, for example. In some exemplary examples, the semiconductor substrate 201 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 201. Alternatively, the semiconductor substrate 201 may be an active layer of a semiconductor-on-insulator (SOI) substrate or a multi-layered structure such as a silicon-germanium layer formed on a bulk silicon layer.

Figure 2B:
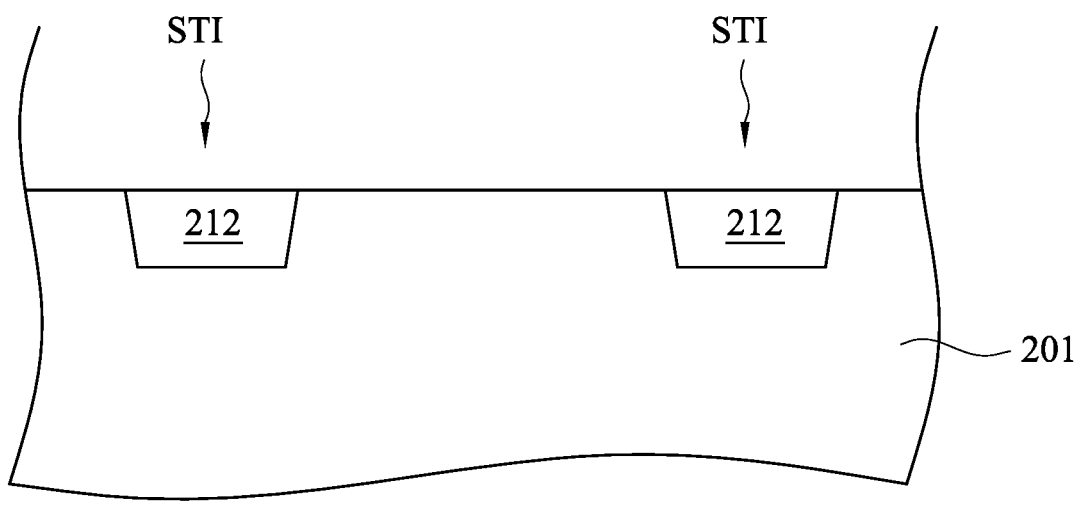

Then, plural shallow trench isolation structures STI are formed in the semiconductor substrate 201 as shown in FIG. 2B. In some embodiments, plural shallow trenches are formed at first, and then the shallow trenches are filled with dielectric layers 212. In some embodiments, the dielectric layers 212 are formed from oxide.

Figure 2C:
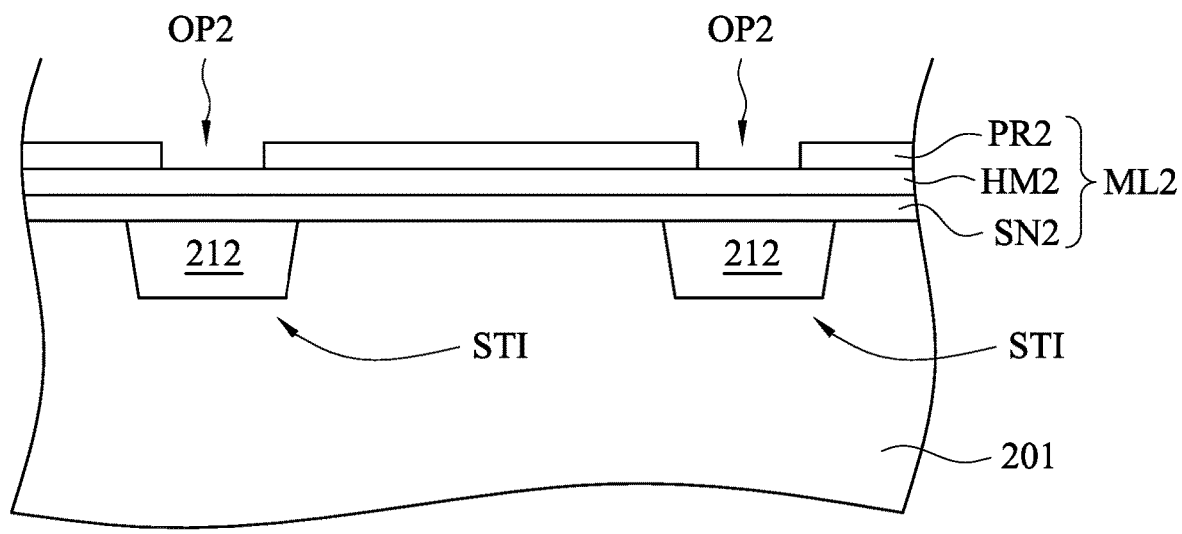

Thereafter, a mask layer ML2 is formed on the semiconductor substrate 201 to cover the shallow trench isolation structures STI as shown in FIG. 2C. In some embodiments, the mask layer ML2 includes a hard mask HM2 and a photoresist layer PR2 located on the hard mask HM2. The photoresist layer PR2 is patterned to include plural openings OP2 corresponding to the shallow trench isolation structures STI in a one-to-one manner. In some embodiments, the mask layer ML2 further includes a silicon nitride layer SN2 located between the hard mask HM2 and the semiconductor substrate 201.

Figure 2D:
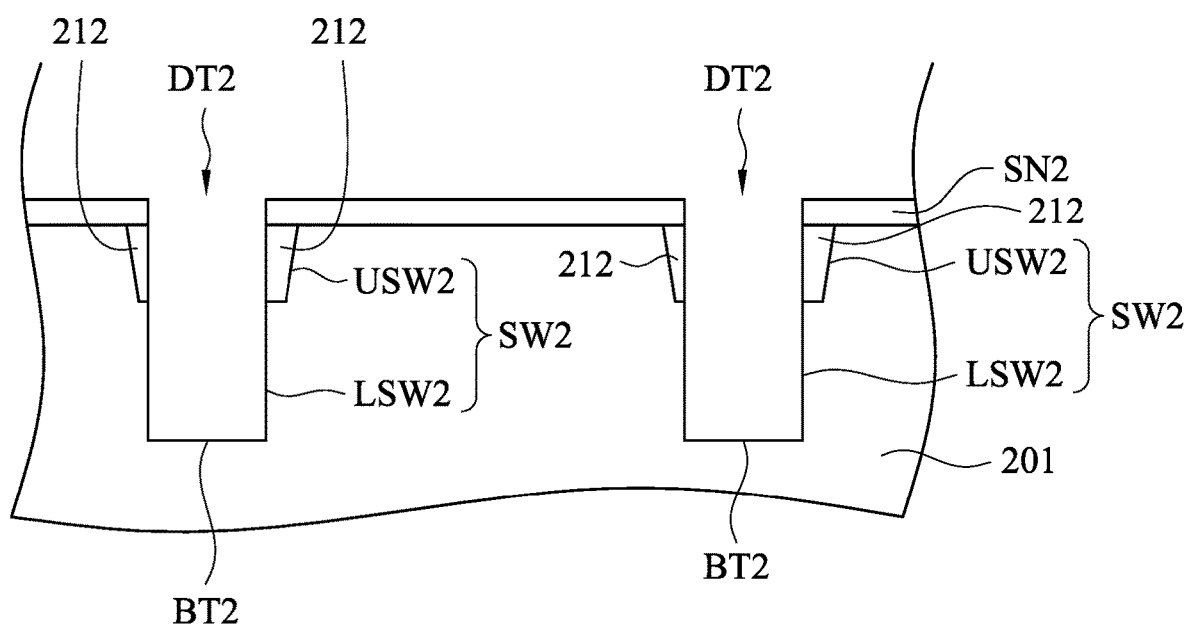

Then, an etching process is performed on the shallow trench isolation structures STI to form plural deep trenches DT2 passing through the shallow trench isolation structures STI, as shown in FIG. 2D. Each of the deep trenches DT2 includes a bottom BT2 and sidewall SW2 located on the bottom BT2. The sidewall SW2 include a lower portion LSW2 and an upper portion USW2 located on the lower portion LSW2. The upper portion USW2 includes a sidewall of the shallow trench of the shallow trench isolation structure STI, because the deep trenches DT2 are formed by etching the shallow trench isolation structures STI. Further, remaining portions of the dielectric layers 212 cover the upper portion USW2 of the sidewall SW2. Each of the remaining portions of the dielectric layers 212 has a width progressively decreasing along a depthwise direction of the dielectric layers 212, because the dielectric layers 212 are dielectric layers of the shallow trench isolation structures STI. In other words, the width of each of the remaining portions of the dielectric layers 212 is progressively decreasing along a direction from a top of the deep trench DT2 to the bottom BT2 of the deep trench DT2.

Figure 2E:
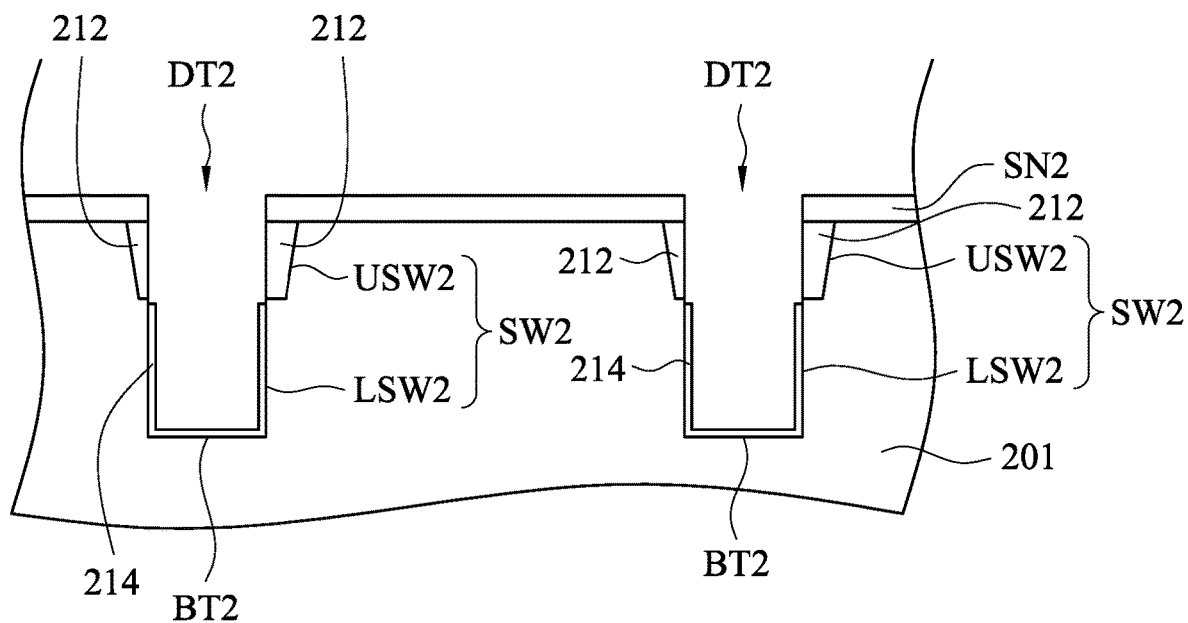

Thereafter, an epitaxial growth process is performed to form epitaxial layers 214 in the deep trenches DT2 as shown in FIG. 2E. Because the upper portion USW2 of the sidewall SW2 is covered by the dielectric layers 212, the epitaxial layers 214 are formed on the lower portion LSW2 of the sidewall SW2 and the bottom BT2, and the upper portion USW2 of the sidewall SW2 is not covered by the epitaxial layers 214.

Figure 2F:
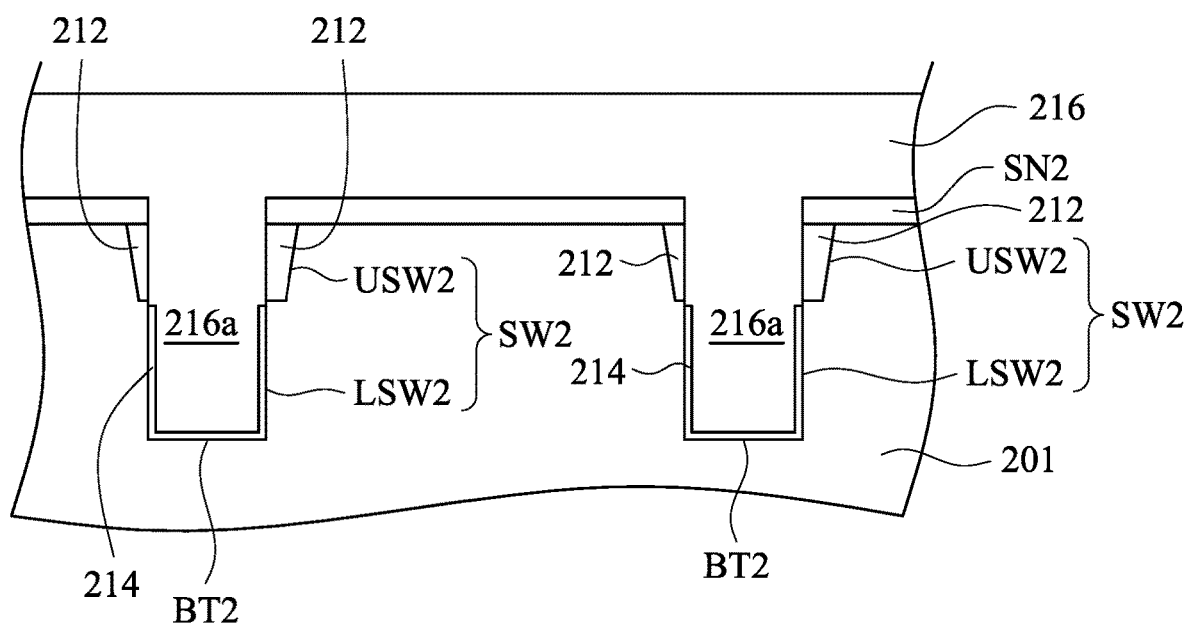

Then, a poly-silicon layer 216 is formed on the semiconductor substrate 201 to fill the deep trenches DT2 with poly-silicon as shown in FIG. 2F. Specifically, the poly-silicon layer 216 includes plural portion 216a, and the deep trenches DT2 are filled with the portions 216a of the poly-silicon layer 216.

Figure 2G:
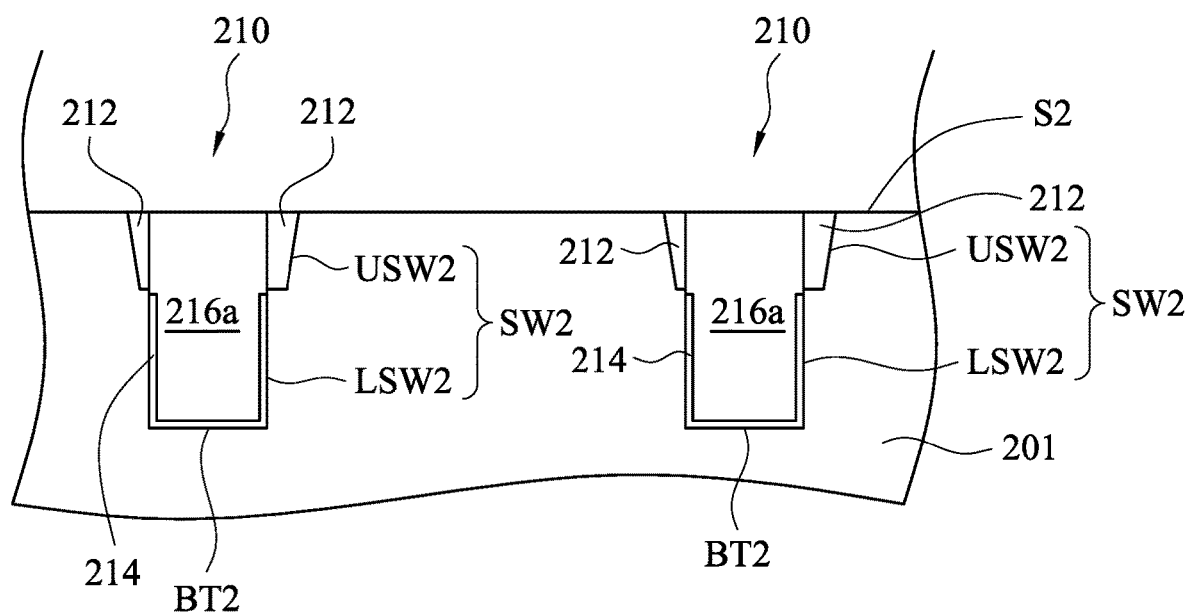

Thereafter, a planarizing process is performed to remove a portion of the poly-silicon layer 216 located outside the deep trenches DT2, thereby forming optical isolation structures 210 as shown in FIG. 2G.

Because the dielectric layers 212 are located between the epitaxial layer 214 and a surface S2 of the semiconductor substrate 201, the dielectric layers 212 are capable of preventing electrical leakage between a contact and the epitaxial layer 214, when the contact is located adjacent to the optical isolation structure 210.

Figure 3:
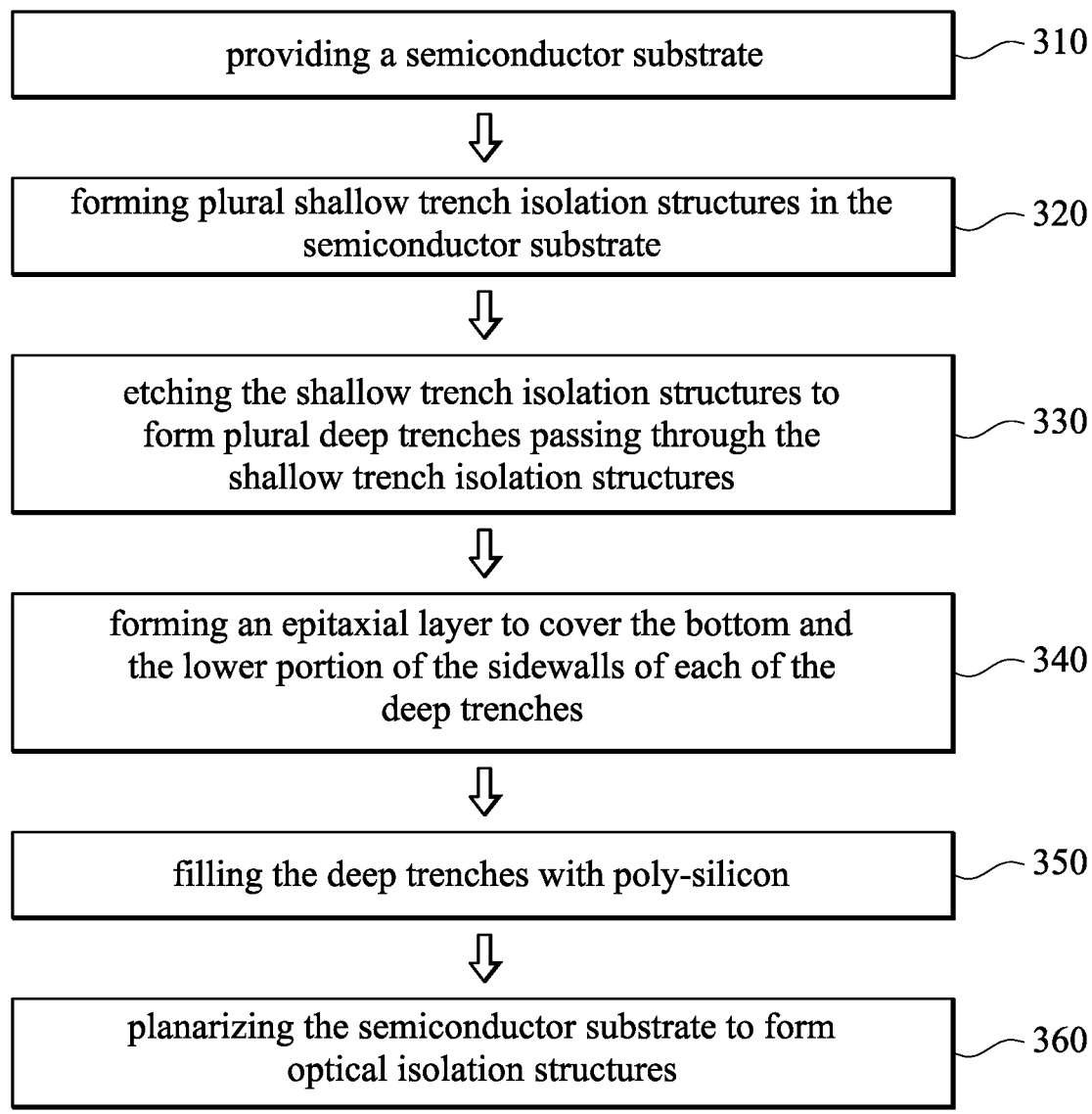
FIG. 3 is a flow chart showing a method 300 for fabricating optical isolation structures in accordance with embodiments of the present disclosure.

Referring to FIG. 3, FIG. 3 is a flow chart showing a method 300 for fabricating optical isolation structures in accordance with embodiments of the present disclosure. The method 300 begins at operation 310. Operation 310 is performed to provide the semiconductor substrate 201 as shown in FIG. 2A.

Then, operation 320 is performed to form plural shallow trench isolation structures STI in the semiconductor substrate 201 as shown in FIG. 2B. In the operation 320, the semiconductor substrate 201 is etched to form plural shallow trenches, and then the dielectric layers 212 are formed in the shallow trenches in a one-to-one manner. In some embodiments, the shallow trenches can be formed by a wet etching process or dry etching process. In some embodiments, the dielectric layers 212 can be formed by using a deposition process such as an atomic layer deposition (ALD). Other methods to form the dielectric layer 212 include chemical vapor deposition (CVD), physical vapor deposition (PVD), and plasma enhanced chemical vapor deposition (PECVD).

Thereafter, operation 330 is performed to etch the shallow trench isolation structures STI to form plural deep trenches DT2 passing through the shallow trench isolation structures STI as shown in FIG. 2C and FIG. 2D.

Then, operation 340 is performed to form the epitaxial layer 214 to cover the bottom BT2 and the lower portion LSW2 of the sidewall SW2 of each of the deep trenches DT2 as shown in FIG. 2E.

Thereafter, operation 350 is performed to form the poly-silicon layer 216 on the semiconductor substrate 201 to fill the deep trenches DT2 with poly-silicon as shown in FIG. 2F. In some embodiments, the poly-silicon layer 216 can be formed by using a deposition process such as an atomic layer deposition (ALD). Other methods to form the poly-silicon layer 216 include chemical vapor deposition (CVD), physical vapor deposition (PVD), and plasma enhanced chemical vapor deposition (PECVD).

Then, operation 360 is performed to planarize the semiconductor substrate 201 to form the optical isolation structure 210 as shown in FIG. 2G. In some embodiments, operation 360 is performed by using chemical-mechanical polishing (CMP) or plasma etch-back. However, embodiments of the present invention are not limited thereto.

Figure 4A:
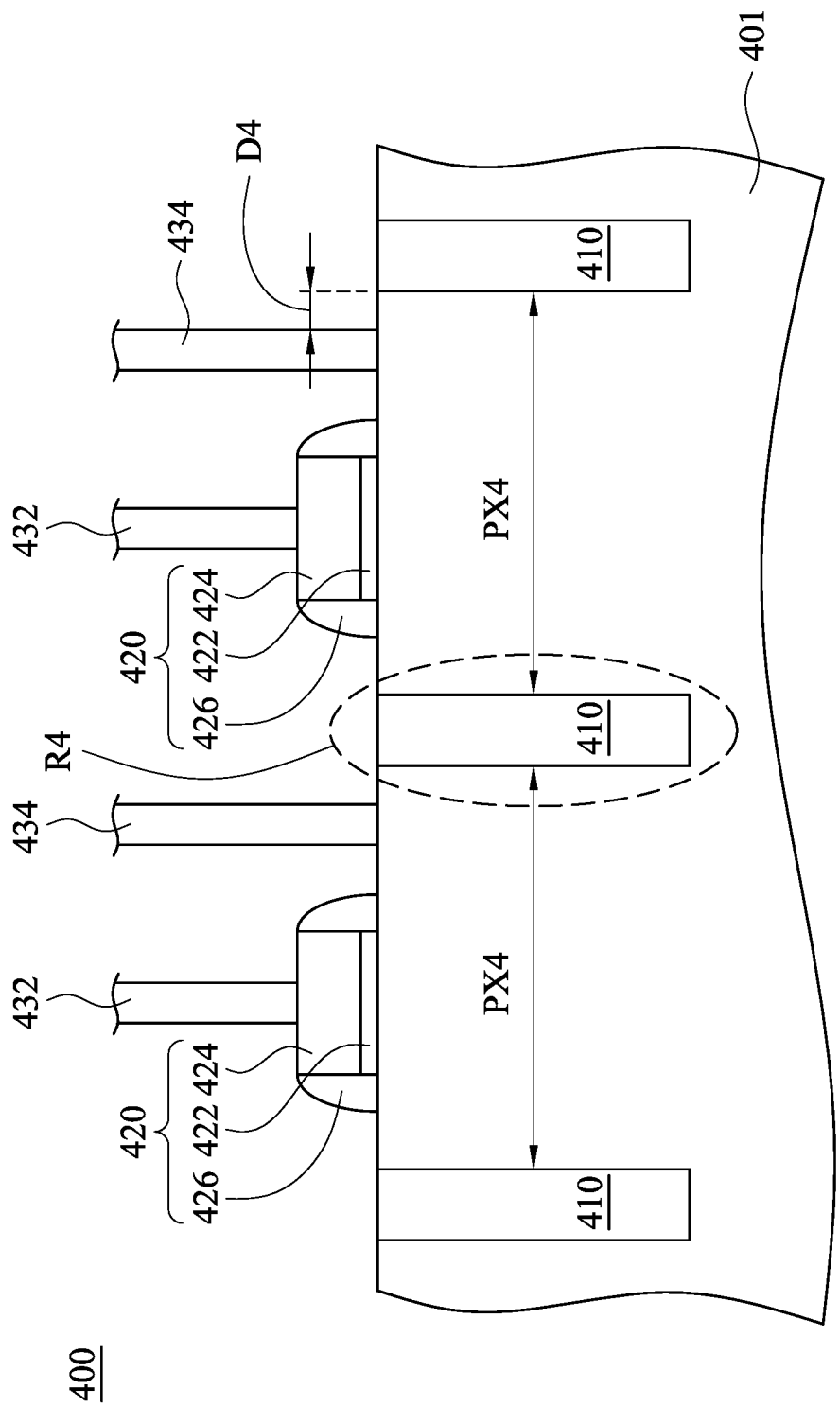
FIG. 4A is a schematic cross-sectional view of an image sensor in accordance with some embodiments of the present disclosure.

Referring to FIG. 4A, FIG. 4A is a schematic cross-sectional view of an image sensor 400 in accordance with some embodiments of the present disclosure. The image sensor 400 includes a semiconductor substrate 401, plural optical isolation structures 410, plural transfer gates 420 and plural contacts 432 and 434. The optical isolation structures 410 are disposed in the semiconductor substrate 401 to define plural pixel regions PX4 in the semiconductor substrate 401. In some embodiments, the optical isolation structures 410 are formed in a grid pattern.

In some embodiments, the semiconductor substrate 401 may be a semiconductor material and may include structures including a graded layer or a buried oxide, for example. In some exemplary examples, the semiconductor substrate 401 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 401. Alternatively, the semiconductor substrate 401 may be an active layer of a semiconductor-on-insulator (SOI) substrate or a multi-layered structure such as a silicon-germanium layer formed on a bulk silicon layer.

In some embodiments, light-sensitive elements (not shown) are disposed in the pixel regions PX4 to convert various types of photo energy of light into electrical signals. The light-sensitive elements can be formed by doping the pixel regions PX4 with an n-type dopant. However, embodiments of the present disclosure are not limited thereto.

The transfer gates 420 are disposed on the pixel regions PX4 and electrically connected to the light-sensitive elements to transfer the electrical signals generated by the light-sensitive element to peripheral circuits. For example, the peripheral circuits include source followers to amplify the electrical signals.

In some embodiments, each of the transfer gates 420 includes a gate dielectric layer 422, a gate electrode layer 424 and spacers 426. The gate electrode layer 424 is formed on the gate dielectric layer 422, and the spacers 426 are formed on sidewalls of the gate electrode layer 424 and the spacers 426.

The gate dielectric layer 422 can be formed by thermal oxidation, chemical vapor deposition, sputtering, or any other methods known and used in the art for forming a gate dielectric. In some embodiments, the gate dielectric layer 422 of the can be formed from a high permittivity (high-k) material (e.g., with a relative permittivity greater than about 5) such as lanthanum oxide, aluminum oxide, hafnium oxide, hafnium oxynitride, or zirconium oxide, or combinations thereof. Additionally, any combination of silicon dioxide, silicon oxynitride, and/or high-k materials may also be used for the gate dielectric layer 422.

The gate electrode layer 424 can be formed from a conductive material and may be selected from a group comprising of polycrystalline-silicon (poly-Si), polycrystalline silicon-germanium (poly-SiGe), metallic nitrides, metallic silicides, metallic oxides, metals, combinations of these, and the like. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, etc. The gate electrode layer 424 may be deposited by chemical vapor deposition (CVD), sputter deposition, or other techniques known and used in the art for depositing conductive materials.

The spacers 426 may be formed from a dielectric material, such as silicon nitride, silicon carbide, silicon oxynitride, other suitable materials, and/or combinations, but embodiments of the present disclosure are not limited thereto. The spacers 426 may be formed by methods utilized to form such a layer, such as chemical vapor deposition (CVD), plasma enhanced CVD, sputter, and other methods known in the art.

The contacts 432 are disposed on the transfer gates 420 to apply control signals on the transfer gates 420, and the contacts 434 are disposed on source/drain regions (not shown) to output the electrical signals to the peripheral circuits. In some embodiments, a distance D4 between the isolation structure 410 and the contact 434 is equal to or smaller than 30 nm.

Figure 4B:
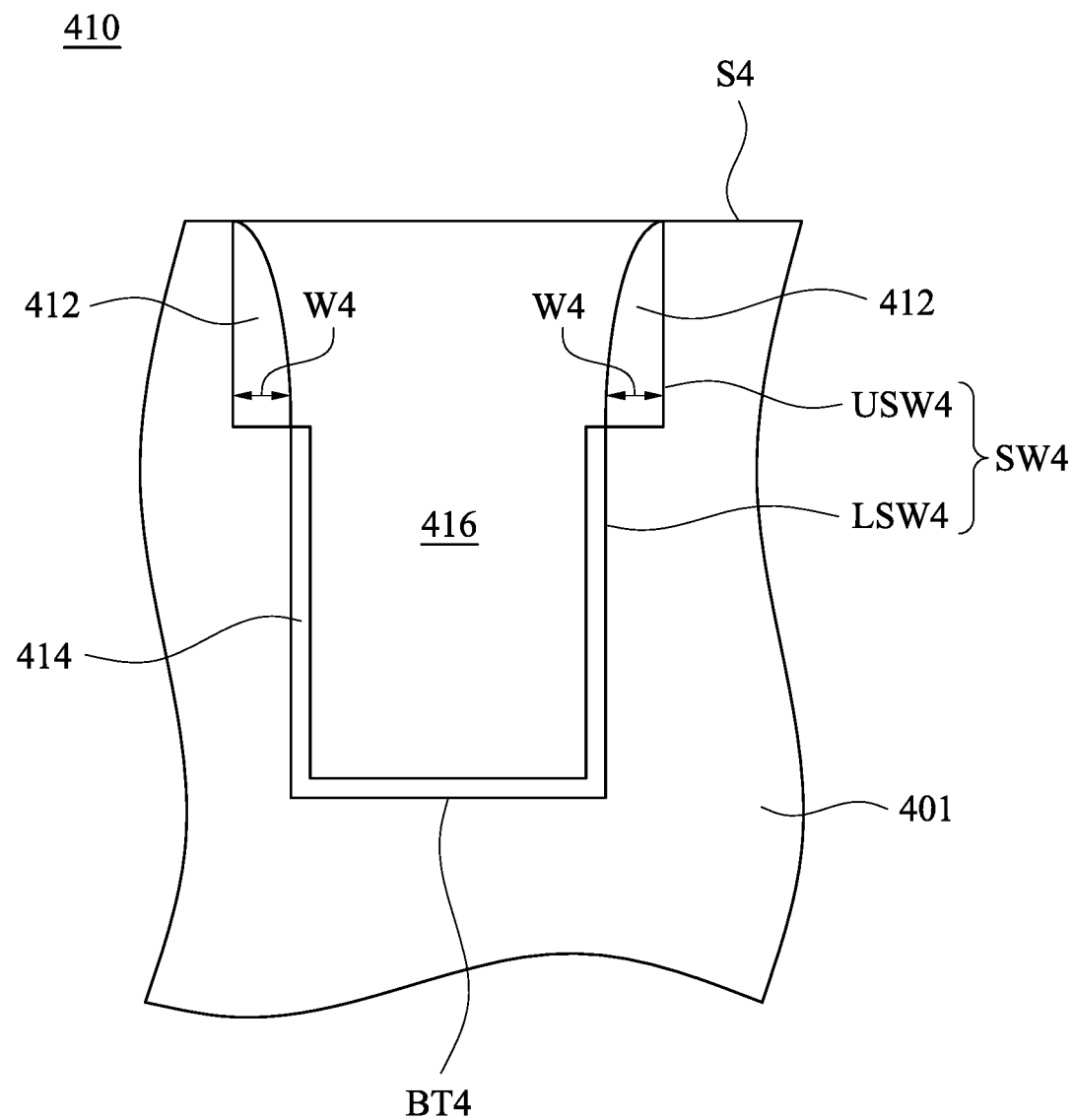
FIG. 4B is an enlarged diagram showing the region R4 in FIG. 4A.

Referring to FIG. 4B, FIG. 4B is an enlarged diagram showing the region R4 in FIG. 4A. As show in FIG. 4B, the optical isolation structure 410 includes dielectric layers 412, an epitaxial layer 414, and a poly-silicon layer 416. The dielectric layers 412, the epitaxial layer 414 and the poly-silicon layer 416 are disposed in a deep trench in the semiconductor substrate 401. The deep trench includes a bottom BT4 and sidewall SW4 located on the bottom BT4. The sidewall SW4 of the deep trench includes a lower portion LSW4 and an upper portion USW4. The upper portion USW4 adjoins a surface S4 of the semiconductor substrate 401.

The epitaxial layer 414 covers the lower portion LSW4 of the sidewall SW4 to reflect light emitted to the optical isolation structure 410. In some embodiments, the epitaxial layer 414 further covers the bottom BT4 of the deep trench. The dielectric layers 412 covers the upper portion USW4 of the sidewall SW4, and thus the dielectric layers 412 are located between the epitaxial layer 414 and the surface S4 of the semiconductor substrate 401. When a contact (for example the contact 434) is located adjacent to the optical isolation structure 410 (for example the distance D4 is equal to or smaller than 30 nm), the dielectric layers 412 are capable of preventing electrical leakage between the contact and the epitaxial layer 414. In some embodiments, the dielectric layers 412 are formed from oxide, but embodiments of the present invention are not limited thereto.

In some embodiments, each of the dielectric layers 412 has width W4. The width W4 is progressively increasing along a direction from a top of the deep trench to the bottom BT4 of the deep trench.

Figure 5A:
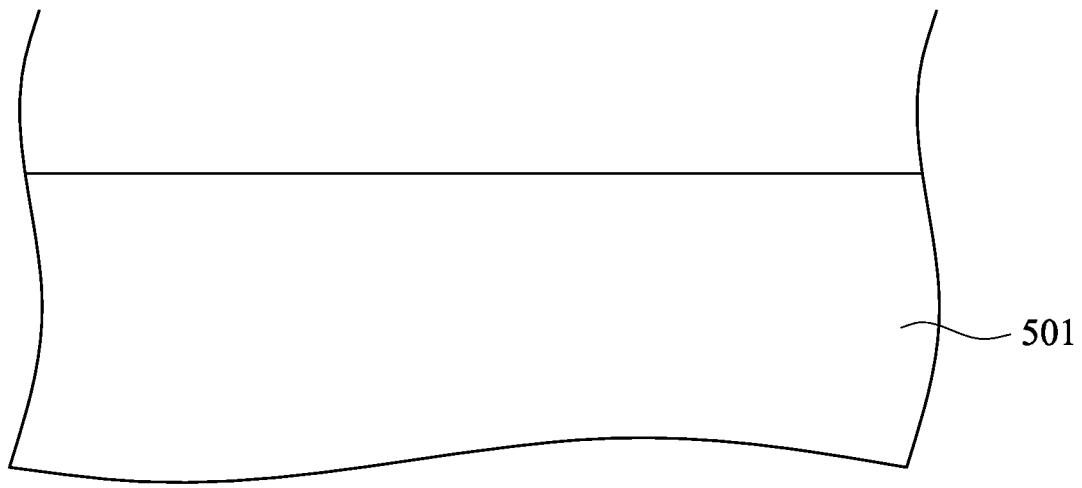
FIG. 5A to FIG. 5H are cross-sectional views of intermediate stages showing a method for fabricating optical isolation structures in accordance with some embodiments of the present disclosure.

Referring to FIG. 5A to FIG. 5H, FIG. 5A to FIG. 5H are cross-sectional views of intermediate stages showing a method for fabricating optical isolation structures in accordance with some embodiments of the present disclosure. As shown in FIG. 5A, a semiconductor substrate 501 is provided at first. In some embodiments, the semiconductor substrate 501 may be a semiconductor material and may include structures including a graded layer or a buried oxide, for example. In some exemplary examples, the semiconductor substrate 501 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 501. Alternatively, the semiconductor substrate 501 may be an active layer of a semiconductor-on-insulator (SOI) substrate or a multi-layered structure such as a silicon-germanium layer formed on a bulk silicon layer.

Figure 5B:
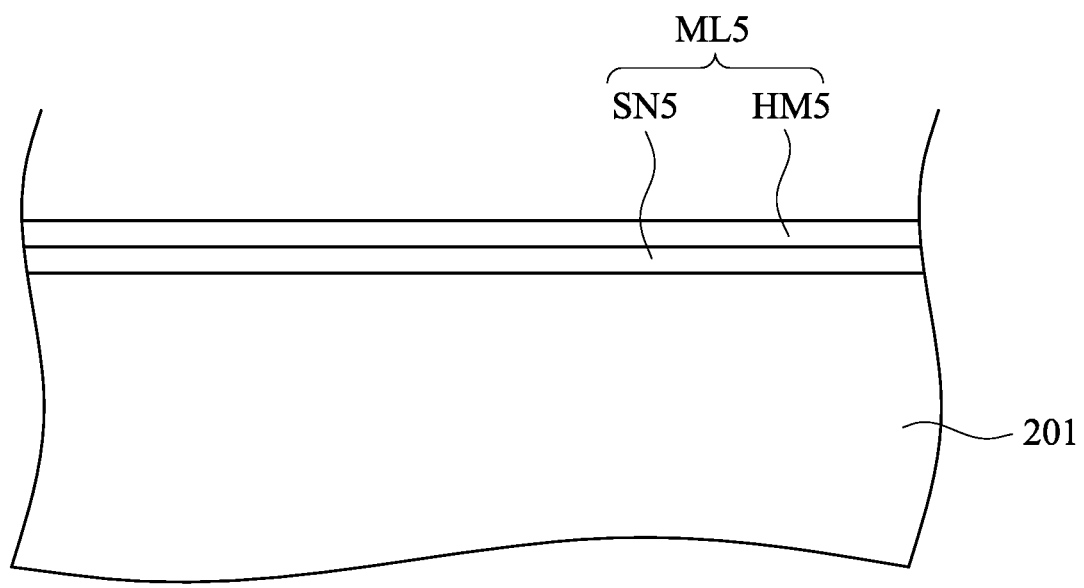

Thereafter, a mask layer ML5 is formed on the semiconductor substrate 501 as shown in FIG. 5B. In some embodiments, the mask layer ML5 includes a hard mask HM5 and a silicon nitride layer SN5 located between the hard mask HM5 and the semiconductor substrate 501.

Figure 5C:
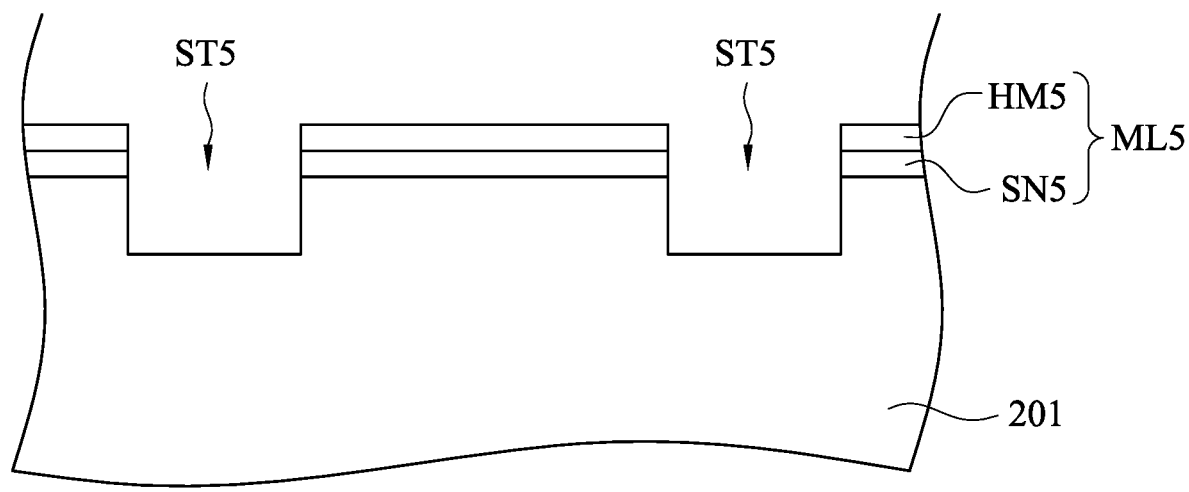

Then, an etching process is performed to form plural shallow trenches ST5 in the semiconductor substrate 501, as shown in FIG. 5C.

Figure 5D:
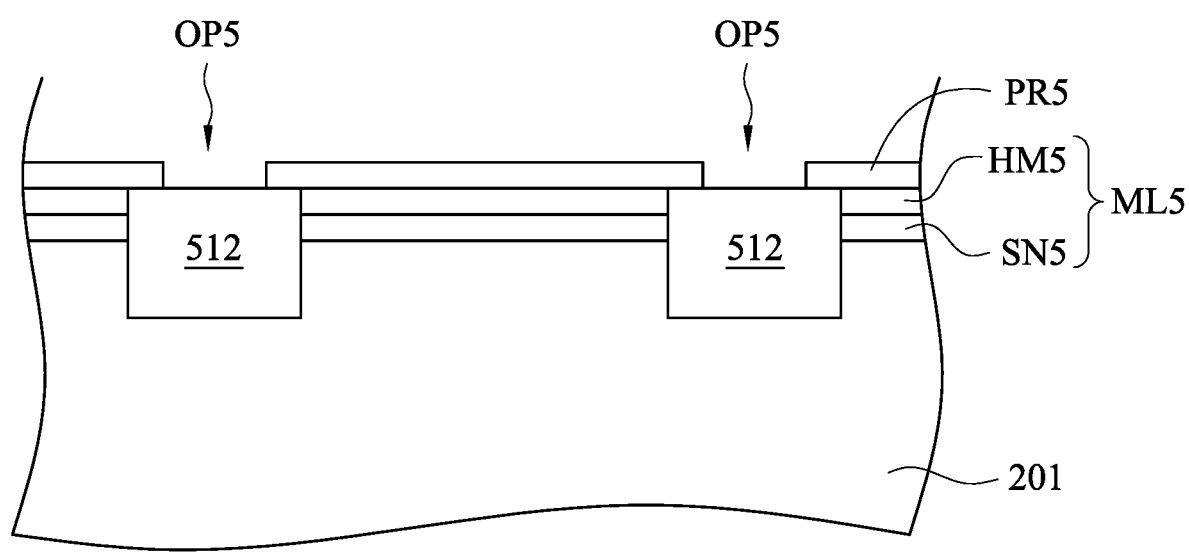

Thereafter, the shallow trenches ST5 are filled with dielectric layers 512, and a photoresist layer PR5 is formed on the dielectric layers 512 as shown in FIG. 5D. The photoresist layer PR5 is patterned to include plural openings OP5, and the openings OP5 are arranged corresponding to the dielectric layers 512 in a one-to-one manner. In some embodiments, the dielectric layers 512 are formed from oxide, but embodiments of the present invention are not limited thereto.

Figure 5E:
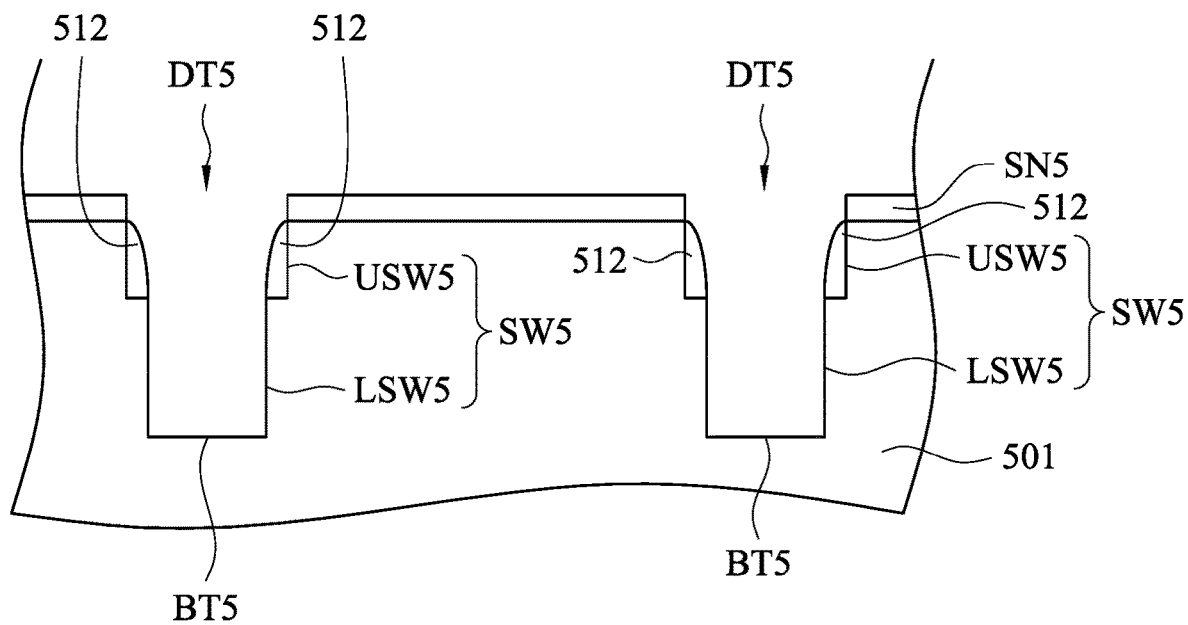

Then, an etching process is performed on the dielectric layers 512 to form plural deep trenches DT5 passing through the dielectric layers 512, as shown in FIG. 5E. Each of the deep trenches DT5 includes a bottom BT5 and sidewall SW5 located on the bottom BT5. The sidewall SW5 include a lower portion LSW5 and an upper portion USW5 located on the lower portion LSW5. The upper portion USW5 includes a sidewall of the shallow trench ST5. Further, remaining portions of the dielectric layers 512 cover the upper portion USW5 of the sidewall SW5, and each of the remaining portions of the dielectric layers 512 has a width progressively increasing along a depthwise direction of the dielectric layers 512. In other words, the width of each of the remaining portions of the dielectric layers 512 is progressively increasing along a direction from a top of the deep trench DT5 to the bottom BT5 of the deep trench DT5.

In some embodiments, the etching process for the dielectric layers 512 can be performed with a great critical dimension (CD), and overlay errors, such as mask misalignment can be improved.

Figure 5F:
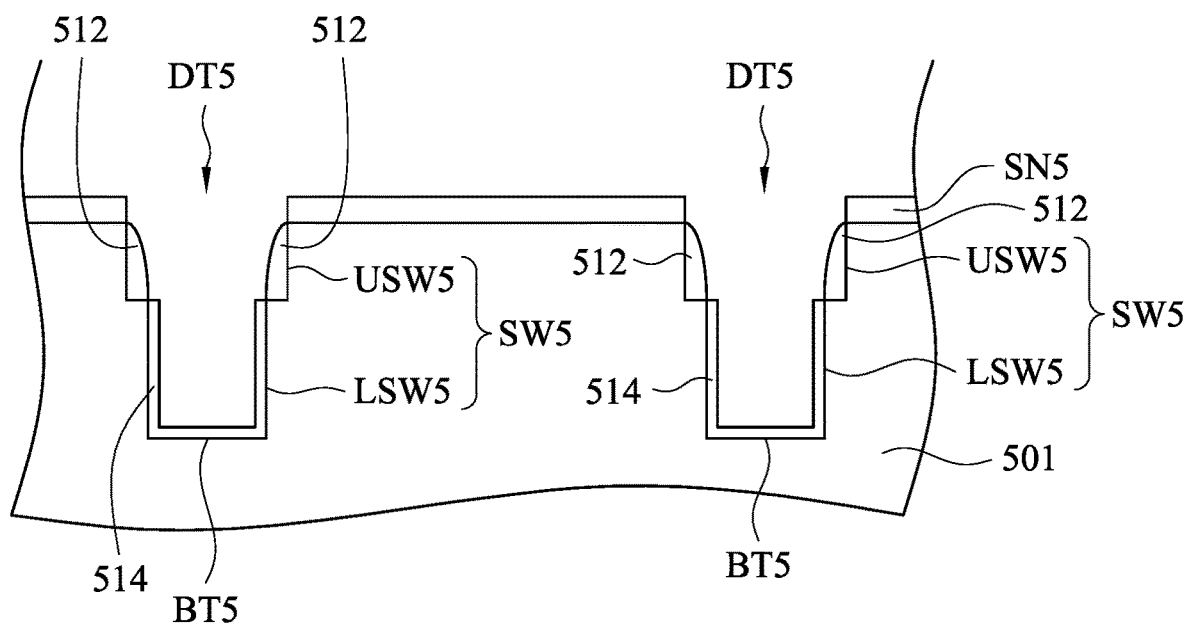

Thereafter, an epitaxial growth process is performed to form epitaxial layers 514 in the deep trenches DT5 as shown in FIG. 5F. Because the upper portion USW5 of the sidewall SW5 is covered by the dielectric layers 512, the epitaxial layers 514 are formed on the lower portion LSW5 of the sidewall SW5 and the bottom BT5, and the upper portion USW5 of the sidewall SW5 is not covered by the epitaxial layers 514.

Figure 5G:
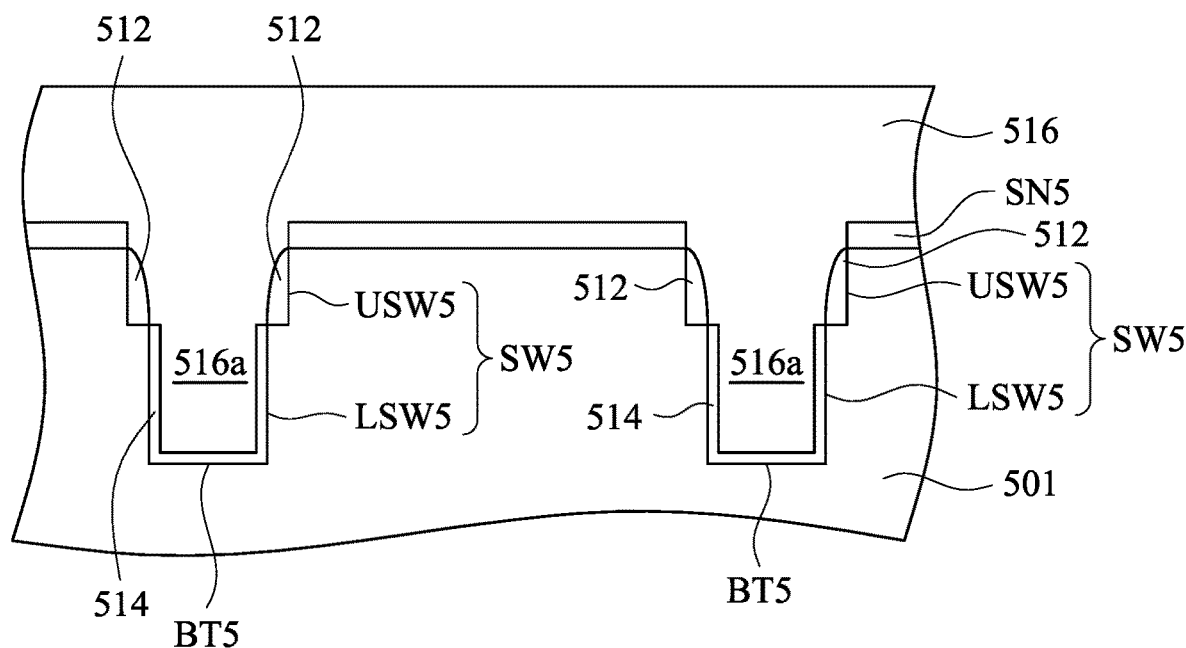

Then, a poly-silicon layer 516 is formed on the semiconductor substrate 501 to fill the deep trenches DT5 with poly-silicon as shown in FIG. 5G. Specifically, the poly-silicon layer 516 includes plural portion 516a, and the deep trenches DT5 are filled with the portions 516a of the poly-silicon layer 516.

Figure 5H:
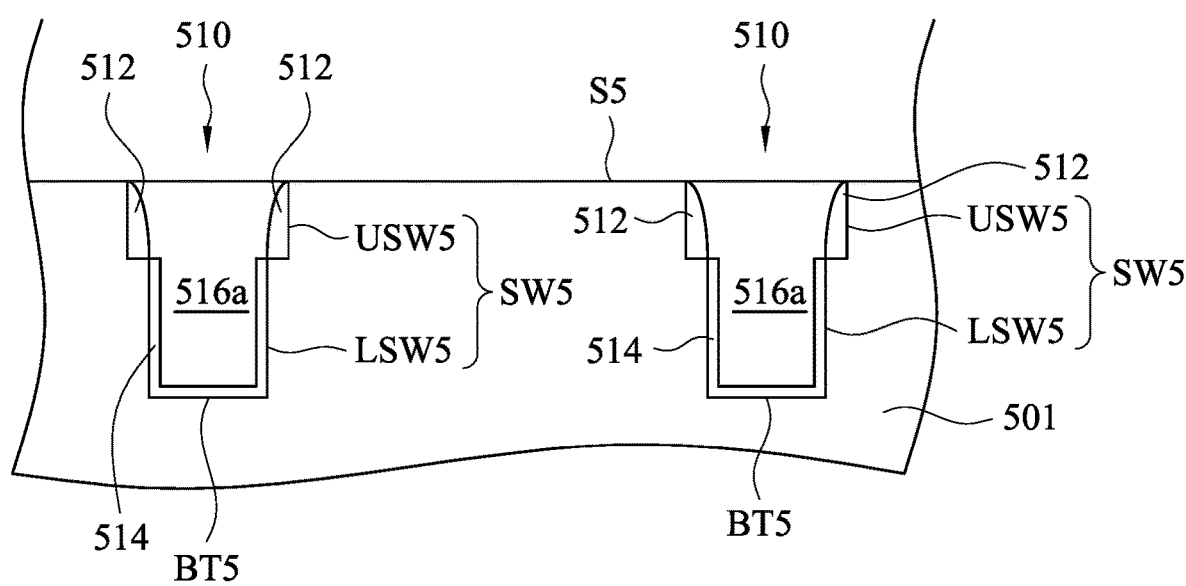

Thereafter, a planarizing process is performed to remove a portion of the poly-silicon layer 516 located outside the deep trenches DT5, thereby forming optical isolation structures 510 as shown in FIG. 5H.

Because the dielectric layers 512 are located between the epitaxial layer 514 and a surface S5 of the semiconductor substrate 501, the dielectric layers 512 are capable of preventing electrical leakage between a contact and the epitaxial layer 514, when the contact is located adjacent to the optical isolation structure 510.

Figure 6:
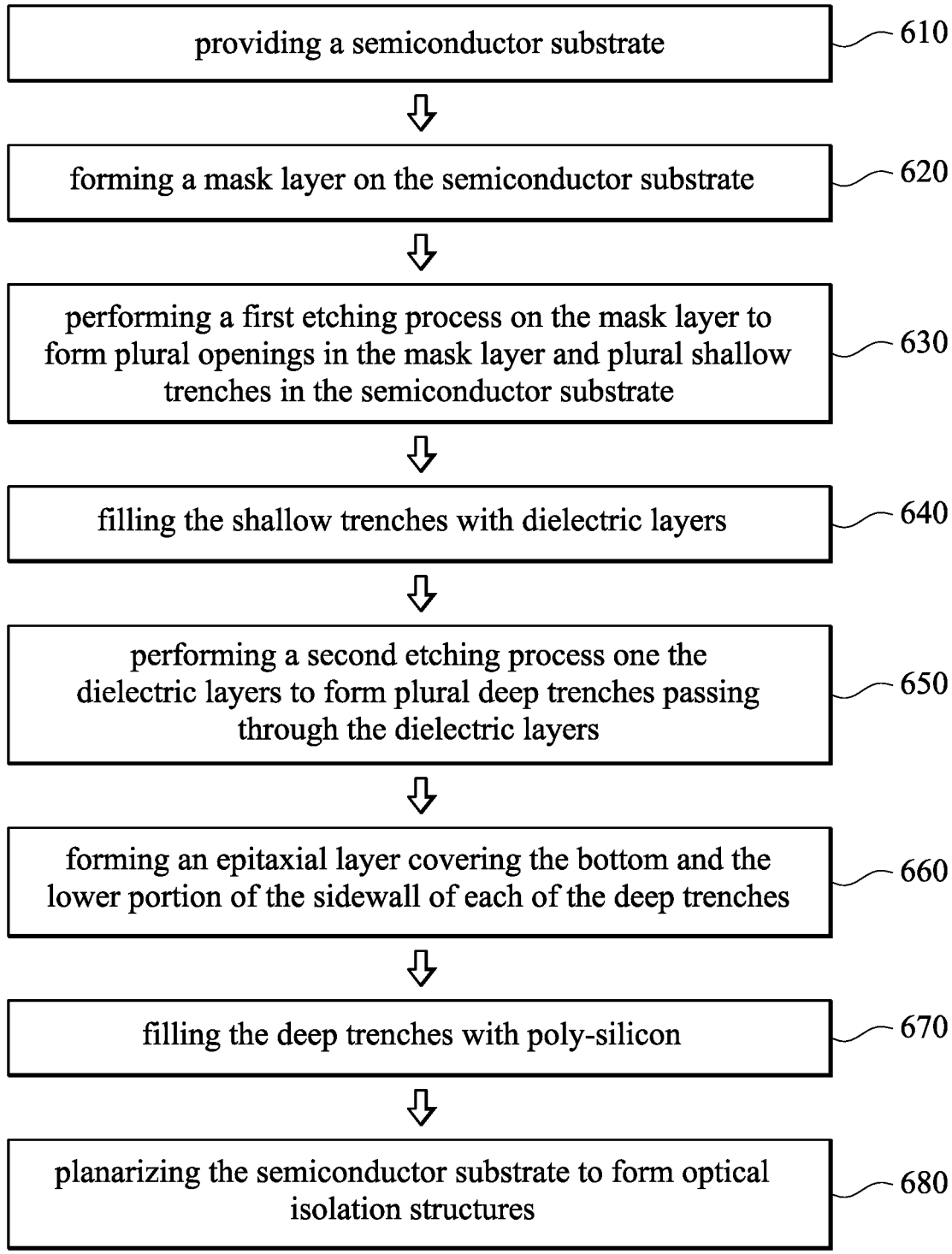
FIG. 6 is a flow chart showing a method for fabricating optical isolation structures in accordance with embodiments of the present disclosure.

Referring to FIG. 6, FIG. 6 is a flow chart showing a method 500 for fabricating optical isolation structures in accordance with embodiments of the present disclosure. The method 600 begins at operation 610. Operation 610 is performed to provide the semiconductor substrate 501 as shown in FIG. 5A.

Then, operation 620 is performed to form the mask layer ML5 on the semiconductor substrate 501 as shown in FIG. 5B.

Thereafter, operation 630 is performed to form the shallow trenches ST5 in the semiconductor substrate 501 as shown in FIG. 5C. In the operation 630, a first etching process is performed on the mask layer ML5 for forming the shallow trenches ST5. In some embodiments, the mask layer ML5 is not removed after the first etching process is performed.

Then, operation 640 is performed to fill the shallow trenches ST5 with the dielectric layers 512 as shown in FIG. 5D. In some embodiments, the dielectric layers 512 can be formed by using a deposition process such as an atomic layer deposition (ALD). Other methods to form the dielectric layer 512 include chemical vapor deposition (CVD), physical vapor deposition (PVD), and plasma enhanced chemical vapor deposition (PECVD). In addition, a photoresist layer PR5 is formed on the dielectric layers 512 for following etching process.

Thereafter, operation 650 is performed to form the deep trenches DT5 passing through the dielectric layers 512 as shown in FIG. 5E. In the operation 650, a second etching process is performed on the dielectric layers 512, and a portion of the mask layer ML5 (for example the silicon nitride layer SN5) is remaining on the semiconductor substrate 501. In some embodiments, the dielectric layers 512 cover the remaining portion of the mask layer ML5 after the second etching process.

Then, operation 660 is performed to form the epitaxial layer 514 to cover the bottom BT5 and the lower portion LSW5 of the sidewall SW5 of each of the deep trenches DT5 as shown in FIG. 5F.

Thereafter, operation 670 is performed to form the poly-silicon layer 516 on the semiconductor substrate 501 to fill the deep trenches DT5 with poly-silicon as shown in FIG. 5G. In some embodiments, the poly-silicon layer 516 can be formed by using a deposition process such as an atomic layer deposition (ALD). Other methods to form the poly-silicon layer 516 include chemical vapor deposition (CVD), physical vapor deposition (PVD), and plasma enhanced chemical vapor deposition (PECVD).

Then, operation 680 is performed to planarize the semiconductor substrate 501 to form the optical isolation structure 510 as shown in FIG. 5H. In some embodiments, operation 680 is performed by using chemical-mechanical polishing (CMP) or plasma etch-back. However, embodiments of the present invention are not limited thereto.

In accordance with an embodiment of the present disclosure, the present disclosure discloses a semiconductor device. The semiconductor device includes a trench structure, an epitaxial layer and a dielectric layer. The trench structure is formed in a semiconductor substrate. The trench structure includes a sidewall comprising an upper portion and a lower portion adjoining the upper portion, and the upper portion adjoins a surface of the semiconductor substrate. The epitaxial layer covers the lower portion of the sidewall of the trench structure. The dielectric layer covers the upper portion of the sidewall of the trench structure.

In accordance with another embodiment of the present disclosure, the present disclosure discloses method for fabricating an optical isolation structure. In the method, at first, a semiconductor substrate is provided. Then, plural shallow trench isolation structures are formed in the semiconductor substrate, in which each of the shallow trench isolation structures includes a dielectric layer formed in a shallow trench of the semiconductor substrate. Thereafter, the shallow trench isolation structures are etched to form plural trenches passing through the shallow trench isolation structures, in which each of the deep trenches includes an upper portion and a lower portion adjoining the upper portion, and the upper portion adjoins a surface of the semiconductor substrate, and a plurality of remaining portions of the dielectric layer located are located on the upper portion of the sidewall. Then, an epitaxial layer is formed to cover the bottom and the lower portion of the sidewall of each of the deep trenches.

In accordance with another embodiment of the present disclosure, the present disclosure discloses method for fabricating an optical isolation structure. In the method, at first, a semiconductor substrate is provided. Then, a mask layer is formed on the semiconductor substrate. Thereafter, a first etching process is performed on the mask layer to form plural shallow trenches in the semiconductor substrate. Then, the shallow trenches are filled with plural dielectric layers. Thereafter, a second etching process is performed on the dielectric layers to form plural deep trenches passing through the dielectric layers, in which each of the deep trenches includes an upper portion and a lower portion adjoining the upper portion, and the upper portion adjoins a surface of the semiconductor substrate, and a plurality of remaining portions of the dielectric layer located are located on the upper portion of the sidewall. Then, an epitaxial layer is formed to cover the bottom and the lower portion of the sidewall of each of the deep trenches.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a deep trench filling material in a semiconductor substrate, wherein the deep trench filling material comprises an upper portion and a lower portion;
   an epitaxial layer surrounding the lower portion of the deep trench filling material and contacting a bottom surface of the deep trench filling material, wherein the epitaxial layer is conductive; and
   a dielectric layer surrounding and contacting the upper portion of the deep trench filling material, wherein an inner sidewall of the dielectric layer is aligned with an outer sidewall of the epitaxial layer, wherein the dielectric layer is in the semiconductor substrate and has a bottom surface in contact with the semiconductor substrate and higher than the bottom surface of the deep trench filling material.

2. The semiconductor device of claim 1, wherein a width of the dielectric layer is progressively increasing along a direction from a top of the deep trench filling material to a bottom of the deep trench filling material.

3. The semiconductor device of claim 1, wherein a width of the dielectric layer is progressively decreasing along a direction from a top of the deep trench filling material to a bottom of the deep trench filling material.

4. The semiconductor device of claim 1, wherein a top surface of the deep trench filling material is coplanar with a top surface of the semiconductor substrate.

5. The semiconductor device of claim 1, wherein an entirety of the epitaxial layer is below the dielectric layer.

6. The semiconductor device of claim 1, wherein an upper portion of the inner sidewall of the dielectric layer is in contact with the deep trench filling material.

7. The semiconductor device of claim 1, wherein the dielectric layer has a trapezoid cross-sectional shape.

8. A semiconductor device, comprising:
a semiconductor substrate;
a plurality of optical isolation structures disposed in the semiconductor substrate to define a plurality of pixel regions, wherein each of the optical isolation structures comprises:
a deep trench filling material in the semiconductor substrate;
an epitaxial layer surrounding a lower portion of a sidewall of the deep trench filling material, wherein the epitaxial layer is conductive; and
a dielectric layer in the semiconductor substrate and surrounding an upper portion of the sidewall of the deep trench filling material, wherein the epitaxial layer has a first portion extending along a bottom surface of the deep trench filling material and a second portion extending from the first portion along the sidewall of the deep trench filling material to a bottom surface of the dielectric layer but not beyond the bottom surface of the dielectric layer, and the bottom surface of the dielectric layer extends from a sidewall of the semiconductor substrate at least to an outer sidewall of the epitaxial layer without extending to an inner sidewall of the epitaxial layer;
a plurality of transfer gates disposed in the pixel regions; and
a contact coupled to one of the pixel regions between one of the transfer gates and one of the optical isolation structures.

9. The semiconductor device of claim 8, wherein the dielectric layer is formed from oxide.

10. The semiconductor device of claim 8, wherein the deep trench filling material comprises poly-silicon.

11. The semiconductor device of claim 8, wherein the dielectric layer adjoins a surface of the semiconductor substrate.

12. The semiconductor device of claim 8, wherein a width of the dielectric layer is progressively increasing along a direction from a top of the deep trench filling material to a bottom of the deep trench filling material.

13. The semiconductor device of claim 8, wherein a width of the dielectric layer is progressively decreasing along a direction from a top of the deep trench filling material to a bottom of the deep trench filling material.

14. The semiconductor device of claim 8, wherein the outer sidewall of the epitaxial layer is in contact with the semiconductor substrate.

15. A semiconductor device, comprising:
a semiconductor substrate having a stepped sidewall that has an upper portion and a lower portion below and misaligned with the upper portion;
a deep trench filling material in the semiconductor substrate, wherein the deep trench filling material comprises an upper portion and a lower portion adjoining the upper portion, and the deep trench filling material is defined by a single piece of dielectric material that is continuous throughout;
an epitaxial layer surrounding the lower portion of the deep trench filling material, wherein the epitaxial layer is conductive; and
a plurality of dielectric layers surrounding the upper portion of the deep trench filling material, wherein bottom surfaces of the dielectric layers are lower than a top surface of the semiconductor substrate, and the deep trench filling material has a sidewall in contact with the epitaxial layer and the dielectric layers, the upper portion of the semiconductor substrate is in contact with one of the dielectric layers, and the lower portion of the semiconductor substrate is in contact with the epitaxial layer.

16. The semiconductor device of claim 15, wherein a width of the deep trench filling material is progressively decreasing along a direction from a top of the deep trench filling material to a bottom of the deep trench filling material.

17. The semiconductor device of claim 15, wherein the dielectric layers are formed from oxide.

18. The semiconductor device of claim 15, wherein the epitaxial layer further covers a bottom of the deep trench filling material.

19. The semiconductor device of claim 15, wherein the epitaxial layer defines a lower trench in the lower portion of a trench structure formed in the semiconductor substrate, the dielectric layers define an upper trench on the lower trench, and the deep trench filling material fills the lower trench and the upper trench.

20. The semiconductor device of claim 19, wherein the dielectric layers sandwich an upper portion of the deep trench filling material, and the epitaxial layer wraps a lower portion of the deep trench filling material.

* * * * *